(12) United States Patent
Chaitanya et al.

(10) Patent No.: US 11,747,415 B2
(45) Date of Patent: Sep. 5, 2023

(54) METHOD AND SYSTEM FOR MONITORING DEPLETION OF A COOLANT IN A COOLING SYSTEM

(71) Applicant: Siemens Healthcare GmbH, Erlangen (DE)

(72) Inventors: Anupam Chaitanya, Bangalore (IN); Tushar Mahajan, Bangalore (IN); Manivannan Sundarapandian, Bangalore (IN)

(73) Assignee: Siemens Healthcare GmbH, Erlangen (DE)

( * ) Notice: Subject to any disclaimer, the term of this patent is extended or adjusted under 35 U.S.C. 154(b) by 24 days.

(21) Appl. No.: 17/372,724

(22) Filed: Jul. 12, 2021

(65) Prior Publication Data

US 2022/0018916 A1 Jan. 20, 2022

(30) Foreign Application Priority Data

Jul. 20, 2020 (EP) .................... 20186724

(51) Int. Cl.
| | | |
|---|---|---|
| G01R 33/34 | (2006.01) | |
| G01R 33/341 | (2006.01) | |
| G06F 1/20 | (2006.01) | |
| G06T 7/00 | (2017.01) | |

(52) U.S. Cl.
CPC ....... G01R 33/3403 (2013.01); G01R 33/341 (2013.01); G06F 1/206 (2013.01); G06T 7/0012 (2013.01); *G06T 2207/10088* (2013.01)

(58) Field of Classification Search
CPC ... G01R 33/3403; G01R 33/341; G06F 1/206; G06T 7/0012; G06T 2207/10088; F25B 2500/06; F25B 2500/19; F25B 2700/00; F25B 49/00
See application file for complete search history.

(56) References Cited

U.S. PATENT DOCUMENTS

2019/0072624 A1* 3/2019 Biber .................. G01R 33/583

FOREIGN PATENT DOCUMENTS

| EP | 1180694 A1 | 2/2002 |
| EP | 3364206 A1 | 8/2018 |
| KR | 101768856 B1 | 8/2017 |

OTHER PUBLICATIONS

European Search Report for European Application No. 20 186 724.9-1008 dated Nov. 20, 2020.

* cited by examiner

*Primary Examiner* — Gregory H Curran
(74) *Attorney, Agent, or Firm* — Lempia Summerfield Katz LLC (57) ABSTRACT

A method of monitoring depletion of a coolant in a cooling system associated with imaging modality is disclosed. The method includes receiving set of signal values from sensing unit, wherein set of signal values correspond to parameters of cooling system, determining class associated with set of signal values using an artificial intelligence model, selecting prediction model capable of predicting depletion rate of the coolant based on class associated with set of signal values, computing depletion rate of coolant in cooling system based on set of signal values using the selected prediction model, determining number of days remaining to refill the coolant in cooling system based on the depletion rate of the coolant in cooling system, and generating warning signal on graphical user interface, warning signal indicative of number of days remaining to refill coolant in cooling system.

15 Claims, 6 Drawing Sheets

FIG 1

100 Imaging modality
102 Magnet
104 Gradient coil
106 Radio frequency coil
108 Scanner
110 Cooling system

FIG 2

110 Cooling system
202 Cooling storage unit
204 Sensing unit
206 Processing unit
208 Memory unit
210 Cooling system
212 Depletion rate prediction module
214 Storage unit
216 AI model database
218 Prediction model database
220 Input unit
222 Display unit
224 Bus

FIG 4

400 Process flowchart
402 Receive set of signal values
404 Determine class
406 Select prediction model
408 Compute depletion rate
410 Determine number of days remaining
412 Generate warning signal

FIG 5

500 Schematic representation depicting classification
502 Feature data
504 Trained artificial intelligence model
506 Input layer
508 Hidden layers
510 Output layer
512 Prediction model
514 Prediction model
516 Prediction model
518 Prediction model

700 Process flowchart
702 Determine third point
704 Determine time period
706 Determine number of days remaining

METHOD AND SYSTEM FOR MONITORING DEPLETION OF A COOLANT IN A COOLING SYSTEM

The present patent document claims the benefit of European Patent Application No. 20186724.9, filed Jul. 20, 2020, which is hereby incorporated by reference in its entirety.

FIELD OF THE TECHNOLOGY

The present disclosure relates to the field of cooling system for imaging modalities, and more particularly to a method and system for monitoring depletion of a coolant in a cooling system associated with an imaging modality.

BACKGROUND

Generally, in medical imaging devices such as Magnetic resonance imaging (MRI) devices that run for longer period of times and dissipate heat, cooling systems are an integral part configured to remove the dissipated heat from the associated components.

Conventionally, the cooling systems provided are employed to dissipate heat from various components, for example, a main coil or a resonance module in some of the devices. One of the cooling options is to employ a passive cooling device using a heat exchanger. This requires an external chilled water source for heat transfer. The coolant such as water evaporates due to external heat exchange and hence depletes from the circuit over a period of time. As a result, the depletion of the coolant causes reduction in the cooling process, and hence, the coolant needs to be refilled periodically in the cooling system. Failure of timely refill of the coolant may create several problems in the associated system, such as creation of 'helium boil' in the magnetic coil, and further leading to damage of the magnetic coil which may further lead to a breakdown of the system employing the cooling system such as the MR device. Furthermore, refilling of the coolant is a maintenance activity, that would require shut down of the devices which leads to interruption in an operation of the devices.

Furthermore, specifically in case of medical devices, the coils are configured to be kept from overheating. In case of increased temperatures of the resonance module or the patient surface, imaging scans are interrupted or limited to low power sequences, which in turn reduces the efficiency and efficacy of the MR system. Time is then lost because imaging sessions cannot begin anew until the resonance module cools sufficiently, thereby causing inconvenience to both the patient and the physician.

In light of the above, there exists a need for a method and system for monitoring depletion of a coolant in a cooling system associated with an imaging modality.

Therefore, the object of the disclosure is to provide a method and a system, for monitoring depletion of a coolant in a cooling system associated with at least one imaging modality.

SUMMARY

The object of the present disclosure is achieved by a method of monitoring depletion of a coolant in a cooling system associated with an imaging modality. The method includes receiving a set of signal values from a sensing unit associated with the cooling system. The set of signal values correspond to one or more parameters of the cooling system. The method includes determining a class associated with the set of signal values using an artificial intelligence model. The method includes selecting a prediction model capable of predicting a depletion rate of the coolant in the cooling system from a plurality of predetermined prediction models based on the class associated with the set of signal values. The method includes computing a depletion rate of the coolant in the cooling system based on the set of signal values using the selected prediction model. The method includes determining a number of days remaining to refill the coolant in the cooling system based on the depletion rate of the coolant in the cooling system. Further, the method includes generating a warning signal on a graphical user interface, the warning signal indicative of a number of days remaining to refill the coolant in the cooling system.

According to an embodiment, the method of computing the depletion rate of the coolant in the cooling system includes determining a first point from the set of signal values having a maximum threshold signal value. The first point is associated with a maximum level of coolant in the cooling system. Further, the method includes determining a second point from the set of signal values having a current signal value. Herein, the second point is associated with a current level of the coolant in the cooling system. The method includes determining a rate of change in magnitude of the set of signal values with respect to the first point and the second point. Further, the method includes determining the depletion rate of the coolant in the cooling system based on the determined rate of change in the magnitude of the set of signal values.

According to an embodiment, the method of determining a number of days remaining to refill the coolant in the cooling system includes determining a third point in the set of signal values having a minimum threshold signal value. The third point corresponds to a minimum level of coolant in the cooling system. Further, the method includes predicting a time period between the determined second point and the determined third point based on the depletion rate of the coolant in the cooling system. The method includes determining a number of days remaining to refill the coolant in the cooling system based on the predicted time period.

According to an embodiment, the depletion rate of the coolant in the cooling system corresponds to a rate of change in magnitude of the set of signal values.

According to an embodiment, the method includes initiating one or more actions in the cooling device when the determined number of days remaining to refill the coolant reaches a minimum threshold value.

According to an embodiment, the method further includes processing the set of signal values to remove one or more anomalies therein.

According to an embodiment, the method of processing of the set of signal values includes replacing one or more missing signal values in the set of signal values with previously obtained set of values in the set of the signal values to obtain a continuous set of signal values.

The object of the present disclosure is achieved by a system including a processing unit and a memory unit coupled to the processing unit. The memory unit includes a set of machine-readable instructions executable by the processing unit wherein the set of machine-readable instructions cause the processing unit to perform aforementioned method acts. The system may be a laptop computer, desktop computer, a tablet, a smart phone, or a server communicatively coupled to the imaging modality.

The object of the present disclosure is achieved by a cooling system including a coolant storage unit capable of storing coolant, a sensing unit configured to measure a set of signal values corresponding to one or more parameters of the coolant storage unit, and a system as disclosed above. The system is capable of performing method acts according to aforementioned method acts.

The object of the present disclosure is also achieved by an imaging modality including a cooling system. The cooling system is capable of performing aforementioned method acts.

The object of the present disclosure is achieved by a cloud computing system including a communication interface communicatively coupled to one or more imaging modalities including a cooling system, one or more processing units communicatively coupled to the communication interface, and a memory unit communicatively coupled to the one or more processing units. The memory unit includes a set of machine-readable instructions executable by the one or more processing units. The set of machine-readable instructions cause the processing unit to perform aforementioned method acts.

BRIEF DESCRIPTION OF DRAWINGS

The present disclosure is further described hereinafter with reference to illustrated embodiments shown in the accompanying drawings, in which.

Hereinafter, embodiments for carrying out the present disclosure are described in detail. The various embodiments are described with reference to the drawings, wherein like reference numerals are used to refer to like elements throughout. In the following description, for purpose of explanation, numerous specific details are set forth in order to provide a thorough understanding of one or more embodiments. It may be evident that such embodiments may be practiced without these specific details.

DETAILED DESCRIPTION

Figure 1:
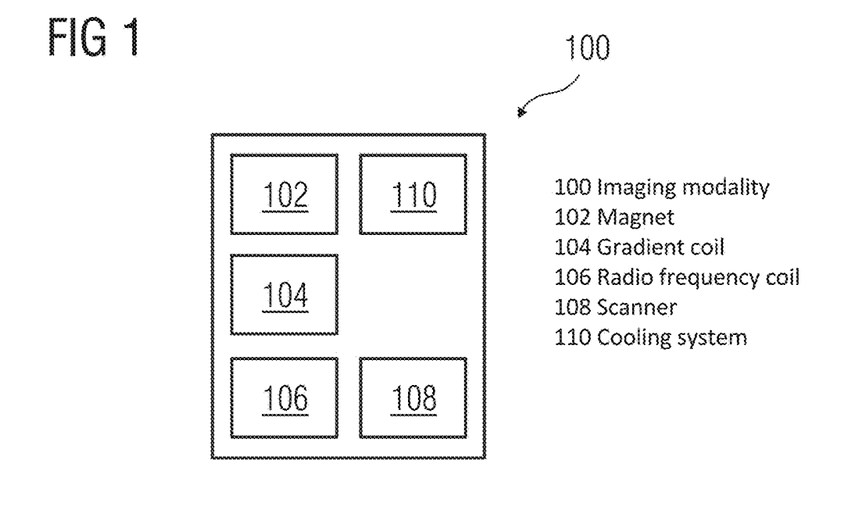
FIG. 1 is a block diagram of an imaging modality with a cooling system for monitoring depletion of coolant, according to an embodiment.

FIG. 1 is a block diagram of a block diagram of an imaging modality 100, according to an embodiment. The imaging modality 100 is a combination of one or more electronic components using a medical imaging technique and in particular refers to a system which applies an energy to an anatomical structure in order to generate (medical) image data, in particular a medical image. The term "imaging modality" 100 as used herein refers to a combination of one or more electronic components using a medical imaging technique and in particular refers to a system which applies an energy to an anatomical structure in order to generate medical image data, in particular a medical image. The type of energy may be defined by the type of electromagnetic radiation applied to the anatomical structure.

The respective type of energy is applied by an analytical device such as an x-ray tube, a computer tomograph, an ultrasound head, or a magnetic resonance tomograph. Examples of imaging modalities 100 include (but are not limited to) x-ray, computed x-ray tomography (also called computed tomography and abbreviated as CT), magnetic resonance tomography (abbreviated as MR or MRT), ultrasound imaging, CT, magnetic resonance imaging (MRI), functional MRI (e.g., fMRI, DCE-MRI, and diffusion MRI), cone beam computed tomography (CBCT), Spiral CT, positron emission tomography (PET), single photon emission computed tomography (SPECT), X-ray, optical tomography, fluorescence imaging, ultrasound imaging, radiotherapy portal imaging, and so forth. The present disclosure is explained in conjunction with the cooling system employed in the aforementioned at least imaging modality. However, the teachings of the disclosure should not be construed limiting to the cooling systems associated with imaging modality 100 but may be implemented in other devices or machines that require a cooling system installed therein for smooth functioning of the devices or machines.

For the purpose of illustration only, the imaging modality 100 includes a magnet 102, one or more gradient coils 104, one or more radio frequency coils 106, a scanner 108, and a cooling system 110. In an exemplary operation, the magnet 102 produces a magnetic field, and the one or more gradient coils 104 and one or more radio frequency coils 106 produce heat that is needed to be removed using the cooling system 110. The imaging modality 100 shown in FIG. 1 includes one or more components of a magnetic resonance imaging device, for the purpose of illustration. The components such as magnet 102, one or more gradient coils 104, one or more radio frequency coils 106, a scanner 108 may be replaced with one or more other components in case of a different imaging modality such as ultrasound imaging, CT, magnetic resonance imaging (MRI), functional MRI (e.g., fMRI, DCE-MRI, and diffusion MRI), cone beam computed tomography (CBCT), Spiral CT, positron emission tomography (PET), single photon emission computed tomography (SPECT), X-ray, optical tomography, fluorescence imaging, ultrasound imaging, radiotherapy portal imaging and so forth, while integrating the cooling system 110 therein.

In an embodiment, the imaging modality 100 may include a graphical user interface (not shown) for displaying a warning signal indicating a number of days remaining to refill the coolant in the cooling device. In another embodiment, the imaging modality 100 includes a user device (not shown) communicatively coupled to the imaging modality 100. Herein, the user device may be associated with personnel operating the imaging modality 100 or monitoring the depletion of the coolant in the cooling system 110. The user device may include the graphical user interface for displaying the warning signal as received from the cooling system 110.

Figure 2:
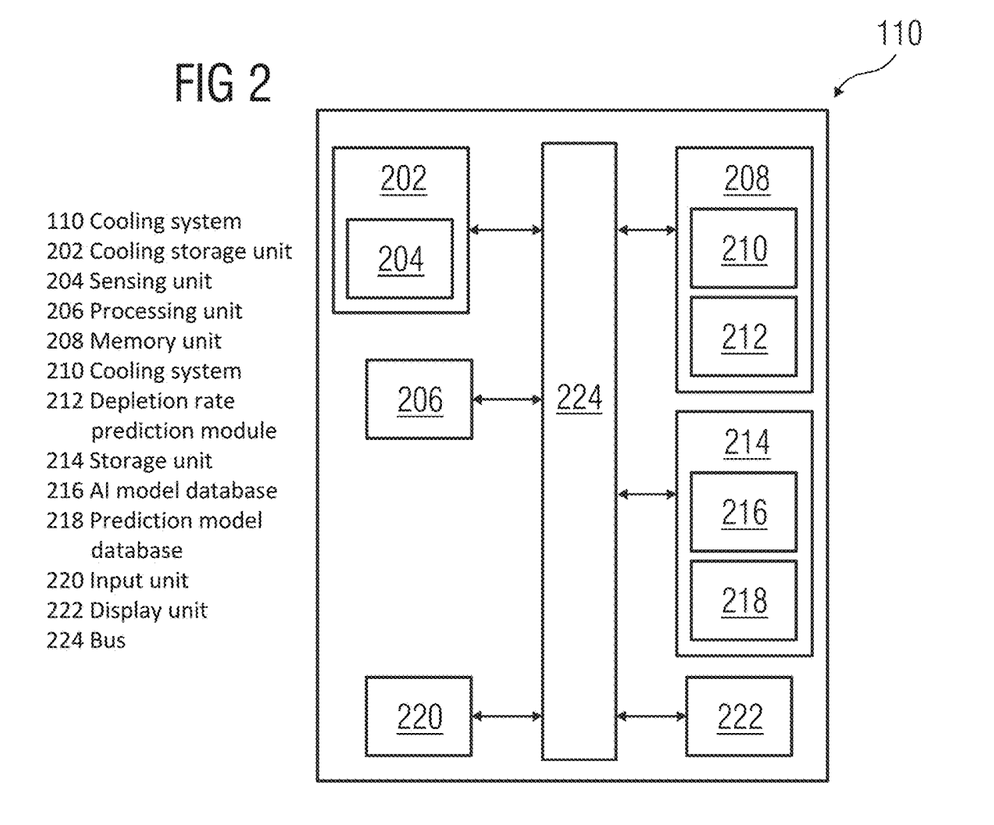
FIG. 2 is a block diagram of a cooling system for monitoring depletion of coolant, according to an embodiment.

FIG. 2 is a block diagram of the cooling system 110 of the imaging modality 100 of FIG. 1, according to an embodiment. The term "cooling system" 110 may refer to a collection of one or more mechanical and/or electronic devices employed to keep the temperature of a structure or device from exceeding limits imposed by needs of safety and efficiency. The cooling system 110 may include a set of coolant tubes arranged near the coils or heating modules and coolant flows through the coolant tubes, thereby decreasing the temperature of the adjacent coils or heating modules. The coolant absorbs heat from the gradient coils as it is pumped through the coolant tubes and transports the heat to a remote heat exchanger/water chiller. Heat is ejected to the atmosphere by way of the heat exchanger/chiller. The coolant used may be a liquid coolant such as water, ethylene, or a propylene glycol mixture and so forth.

As shown, the cooling system 110 includes a coolant storage unit 202, a sensing unit 204 arranged in the coolant storage unit 202, a processing unit 206, and a memory unit 208. In one or more embodiments, the cooling system 110 further includes a set of coolant tubes disposed in thermal contact with the one or more coils 104, 106 of the imaging modality 100. In particular, the coolant storage unit 202 is capable of storing a coolant such as water for dissipating heat from the one or more gradient coils 104 and the radio frequency coils 106 of the imaging modality 100.

The sensing unit 204 is arranged in the coolant storage unit 202 is configured to measure a set of signal values corresponding to one or more parameters of the coolant storage unit 202. The sensing unit 204 may be a level sensor for sensing a level of the coolant filled in a coolant storage unit 202 of the cooling system 110. The term "sensing unit" 204 as used herein refers to a device, module or machine that is configured to sense physical activity in an environment and convert the physical activity into electronic signals for further analysis. The sensing unit 204 is configured to receive a set of signal values by measuring level of the coolant in the coolant storage unit 202. The sensing unit 204 may include a transmitter for transmitting the acquired set of signal values to one or more processing units 204. The set of signal values correspond to one or more parameters of the cooling system 110. The one or more parameters may include one or more characteristics of the cooling system 110 that are related to the set of signal values.

Exemplary parameters may include pressure of the coolant in the coolant storage unit 202 and level of the coolant in the coolant storage unit 202. The set of signal values when analyzed may constitute of a recognizable signal pattern. In an exemplary embodiment, the sensing unit 204 may be a pressure sensor installed in the coolant storage unit 202 of the cooling system 110. The pressure sensor is configured to measure a set of pressure signal values of the coolant stored in the coolant storage unit 202.

The processing unit 206, as used herein, refers to any type of computational circuit, such as, but not limited to, a microprocessor, microcontroller, complex instruction set computing microprocessor, reduced instruction set computing microprocessor, very long instruction word microprocessor, explicitly parallel instruction computing microprocessor, graphics processor, digital signal processor, or any other type of processing circuit. The processing unit 206 may also include embedded controllers, such as generic or programmable logic devices or arrays, application specific integrated circuits, single-chip computers, and the like. The processing unit 206 may include hardware elements and software elements. The processing unit 206 may be configured for multithreading, (e.g., the processing unit 206 may host different calculation processes at the same time), executing the either in parallel or switching between active and passive calculation processes.

The memory unit 208 may be volatile memory and non-volatile memory. The memory unit 208 may be coupled for communication with the processing unit 206. The processing unit 206 may execute instructions and/or code stored in the memory unit 208. A variety of computer-readable storage media may be stored in and accessed from the memory unit 208. The memory 208 may include any suitable elements for storing data and machine-readable instructions, such as read only memory, random access memory, erasable programmable read only memory, electrically erasable programmable read only memory, a hard drive, a removable media drive for handling compact disks, digital video disks, diskettes, magnetic tape cartridges, memory cards, and the like.

The memory 208 includes a signal pattern recognition module 210 and a depletion rate prediction module 212. The modules 210 and 212 may be stored in the form of machine-readable instructions on any of the above-mentioned storage media and may be in communication to and executed by processing unit 208. When executed by the processing unit 208, the signal pattern recognition module 210 causes the processing unit 208 to classify the set of signal values into a class of signal values using an artificial intelligence model. The depletion rate prediction module 212 causes the processing unit 208 to determine a depletion rate of the received set of signal values based on a selected prediction model. The depletion rate prediction module 212 may cause the processing unit 208 to determine number of days remaining to refill the coolant in the cooling system based on the depletion rate of the coolant in the cooling system. Also, the depletion rate prediction module 212 may cause the processing unit 208 to generate a warning signal indicating number of days remaining to refill the coolant in the cooling system on a graphical user interface. Method acts performed by the processing unit 208 to achieve the abovementioned functionality are elaborated upon in detail later in the description.

The storage unit 214 may be a non-transitory storage medium which stores an artificial intelligence model database 216 and a prediction model database 218. The artificial intelligence model database 216 is configured to store trained artificial intelligence models for classifying a given set of signal values into predefined class of signal values. The prediction model database 218 is configured to store one or more prediction models including for determining a depletion rate of the coolant based on classified set of signal values. Exemplary artificial intelligence model may include, but are not limited to, neural network models, deep neural network models, and convolutional neural network models. The input unit 220 may include input devices such as keypad, touch-sensitive display, camera (such as a camera receiving gesture-based inputs), etc. capable of receiving input signals such as selection for specific imaging modalities for generating a warning signal. The display unit 222 may be a device with a graphical user interface displaying a number of days remaining to refill the coolant in the cooling system. The bus 224 acts as interconnect between the processing unit 206, the memory 208, the storage unit 214, the input unit 220, and the display unit 222.

Figure 3:
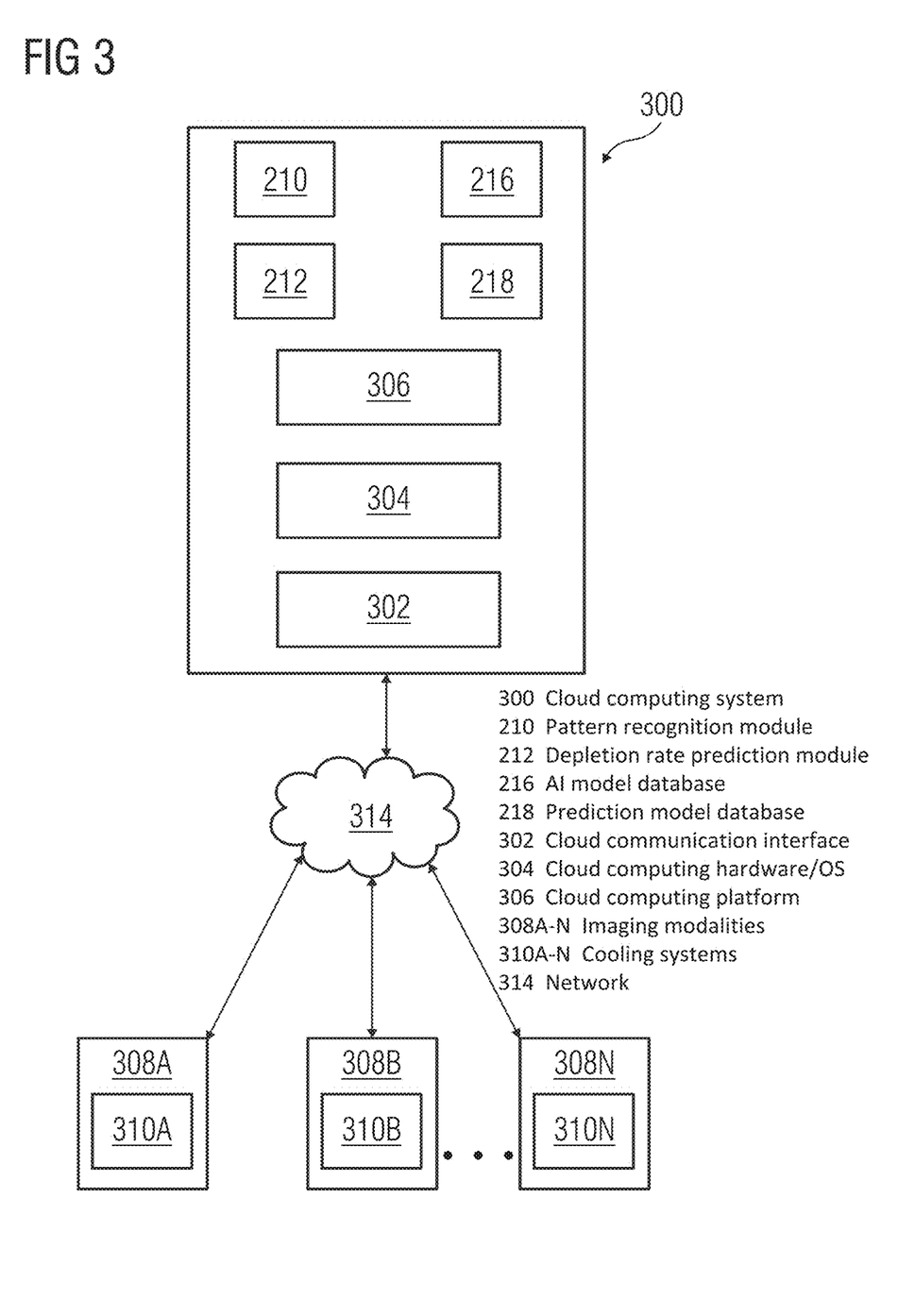
FIG. 3 is a block diagram of a cloud computing system, according to an embodiment.

FIG. 3 is a block diagram of a cloud computing system 300 for monitoring depletion of coolant in the cooling device associated with one or more imaging modalities 308A-N, according to an embodiment. The cloud computing system 300 may be a cloud infrastructure capable of providing cloud-based services such as data storage services, data analytics services, data visualization services, etc. based on the plant data. The cloud computing system 300 may be part of public cloud or a private cloud.

The cloud computing system 300 includes a cloud communication interface 302, cloud computing hardware and OS 304, a cloud computing platform 306, the signal pattern recognition module 210, the depletion rate prediction module 212, the artificial intelligence model database 216, and the prediction model database 218. The cloud communication interface 302 enables communication between the cloud computing platform 306, and imaging modalities 308A-N including respective cooling systems 310A-N, via a network 314.

The cloud computing hardware and OS 304 may include one or more servers on which an operating system (OS) is installed and includes one or more processing units, one or more storage devices for storing data, and other peripherals required for providing cloud computing functionality. The cloud computing platform 306 is a platform which implements functionalities such as data storage, data analytics, data visualization, data communication on the cloud hardware, and OS 304 via APIs and algorithms, and delivers the aforementioned cloud services using cloud-based applications (e.g., computer-aided design application).

In some embodiments, the cloud computing platform 306 employs the signal pattern recognition module 210 using the artificial intelligence model and the depletion rate prediction module 212 for computing depletion rate based on a class of the set of signal values. Additionally, the cloud computing platform 306 includes the artificial intelligence model database 216 for storing trained artificial intelligence models capable of determining a class of the set of signal values received from the sensing unit 204. Further, cloud computing platform 306 includes the prediction model database 218 configured to store number of predictions models. Each of the stored prediction models is associated with a specific class of set of signal values and is capable of computing depletion rate of the given set of signal values. Exemplary artificial intelligence models may include convolutional neural network (CNN) models, deep neural network models, and so on. The cloud computing platform 306 may include a combination of dedicated hardware and software built on top of the cloud hardware and OS 304.

In accordance with the foregoing embodiments, the cloud computing platform 306 is configured to periodically receive signal values associated with coolant in cooling systems in the imaging modalities 308A-N. The cloud computing platform 306 is configured to monitor depletion of coolant in the imaging modalities 308A-N and compute number of days remaining to refill the coolant each of the imaging modalities 308A-N based on the signal values using the artificial intelligence models stored in the artificial intelligence model database 216 and the prediction models stored in the prediction model database 218. Accordingly, the cloud computing platform 306 is configured to generate a warning signal indicative of number of days remaining to refill the coolant in the respective cooling systems 310A-N associated with the imaging modalities 308A-N. Advantageously, the cloud computing system 300 may enable users to remotely monitor depletion of coolant in the cooling systems 310A-N associated with a plurality of imaging modalities 308A-N in real-time. The cloud computing system 300 may enable users to efficiently manage resources for maintenance of the cooling systems 310A-N.

It will be appreciated that such a cloud computing system 300 provides that the plurality of imaging modalities 308A-N may be monitored from a remote location, thereby monitoring a large number of imaging modalities at the simultaneously in real-time with efficiency. Further, such a cloud computing system 300 also provides timely planning and stocking of other resources such as coolant, and scheduled availability of service engineers based on the generated warning signal for each of the imaging modalities 308A-N.

Figure 4:
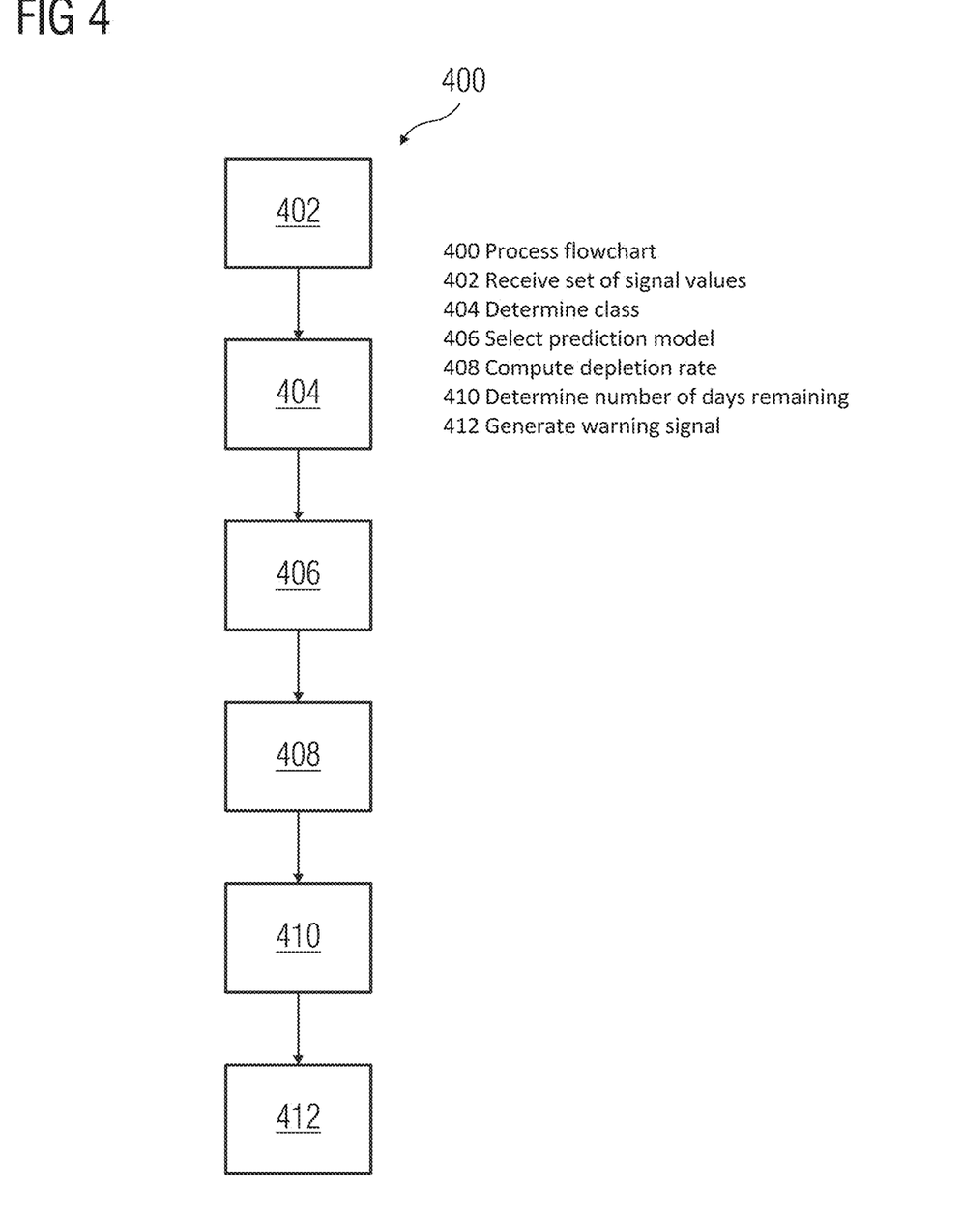
FIG. 4 illustrates a flowchart of a method for monitoring depletion of a coolant in a cooling system associated with an imaging modality, according to an embodiment.

FIG. 4 is a process flowchart 400 of a method of monitoring depletion of a coolant in a cooling system associated with an imaging modality, according to an embodiment. At act 402, a set of signal values is received from the sensing unit 204 associated with the cooling system 110. In particular, the sensing unit 204 is arranged in the coolant storage unit 202. The set of signal values correspond to one or more parameters of the cooling system 110. The one or more parameters may include pressure of the coolant on the sensing unit 204, a level of the coolant in the coolant storage unit 202, and so on.

For the purpose of illustration, the parameter is considered as the pressure of the coolant in the coolant storage unit 202 and the sensing unit 204 is a pressure sensor to receive the set of pressure signal values. In an embodiment, the pressure signal values are received on a daily basis, and each of the signal value received is a data point in the set of signal values. In an example, pressure signal values may be received for 15 consecutive days. In such a scenario, the set of signal values may include 15 data points (e.g., 1 data point corresponding to a pressure value on 1 day).

The received set of signal values is processed to remove one or more anomalies. The one or more anomalies may include unusual or unexpected values in the set of signal values that are not required or that may introduce errors in prediction of depletion of the coolant in the cooling system 110. For example, the set of signal values are processed by replacing one or more missing signal values in the set of signal values with previously obtained set of values in the set of the signal values. In an example, the set of signal values may be a discontinuous signal wave with one or more missing values in the set of signal values. The missing values may be a result of one or more reasons such as loss of data during transmission, unlogged values for a particular day, unlogged values due to loss of power and so forth. The missing values in the set of signal values may lead to errors in the prediction of coolant depletion.

In another example, the set of signal values include anomalies in the form of positive fluctuations in the set of signal values that may further introduce error in prediction of coolant depletion in the cooling system. Herein, positive fluctuations in the set of signal values refer to spikes in the signal values that are discrepancies as the signal values cannot increase in magnitude with respect to time. Therefore, the set of signal values are processed by removing one or more positive fluctuation values from the set of signal values. In another example, the set of signal values includes quantization noise that leads to unexpected decrease in signal values that needs to be mitigated. Therefore, in order to remove the quantization noise, quantization noise is mitigated using one or more signal processing techniques. It will be appreciated that the anomalies in the set of signal values may be eliminated by applying signal processing techniques such as filtering, conditioning, clipping, and other techniques known in the art.

At act 404, class associated with the set of signal values is determined using a trained artificial intelligence model. The artificial intelligence model refers to a to any algorithm that may learn a model or a pattern based on existing information or knowledge and predict or estimate output using input of new information or knowledge. The artificial intelligence model refers to a classification model given a set of training dataset. Each individual sample of the training data may be a pair containing a dataset (e.g., one or more set of signal value from the sensing unit 204) and a desired output value or dataset (e.g., a type of the signal values received from the sensing unit 204). The artificial intelligence model analyzes the training data and produces a predictor function. The predictor function, once derived through training, is capable of reasonably predicting or estimating the correct output value or dataset. In particular, the trained artificial intelligence model receives the set of signal values, analyzes the set of signal values, and classifies the set of signal values to a predefined class label such as a normal depletion pattern, a noise pattern, a staircase pattern, and a high depletion pattern. Exemplary trained artificial intelligence models may include deep neural network, convolutional neural networks, and the like. The artificial intelligence model categorizes each of the received set of signal values into different predefined classes based on an estimation algorithm defining closeness of one or more characteristics of the received set of signal values with one of the predefined classes. In an exemplary embodiment, the artificial intelligence algorithm classifies the set of signal values into any one of the four depletion patterns, namely a normal depletion pattern, a noise pattern, a staircase pattern, and a high depletion pattern. Thus, the artificial intelligence is capable of identifying a new signal pattern and classifying the set of signal values under a new class label.

The artificial intelligence model is pre-trained to identify different classes of a set of signal values using signal pattern training dataset. Furthermore, the artificial intelligence model is trained to provide class labels to each of the set of signal values received from the sensing unit 204. The signal pattern training dataset includes signal feature data such as a value of the signal with respect to time, variation in magnitudes of two consecutive signal values with respect to time, information about the type of signal pattern and so on. The artificial intelligence model is trained with a given set of signal values and an associated predefined class. In an example, if the artificial intelligence model identifies that magnitude of each of the values in a given set of signal values decrease linearly with respect to time, then the given set of signal values is classified as normal depletion pattern.

At act 406, a prediction model capable of predicting a depletion rate of the coolant in the cooling system is selected from a plurality of predetermined prediction models based on the class associated with the set of signal values. As aforementioned, the prediction model is a set of functions that when applied on received set of signal values is capable of outputting a depletion rate of the coolant and a number of days remaining to refill the coolant in the cooling device. Notably, the depletion rate determines an amount of the coolant that is being depleted in the cooling system with respect to time. Each of the class of the set of signal values is associated with a particular prediction model. Furthermore, each of the prediction models is configured to determine the depletion rate of the coolant for a specific class, thereby providing accuracy of determination of the depletion rate. The process of classifying the set of signal values into different classes and corresponding selection of predetermined prediction models is explained in detail later in the description.

At act 408, a depletion rate of the coolant in the cooling system is computed based on the set of signal values using the selected prediction model. Notably, the depletion rate varies for each of the determined classes of the set of signal values. Therefore, the depletion rate is determined using corresponding predetermined prediction models. The computation of the depletion rate of the coolant in the cooling system 110 is explained in greater detail later in the description.

At act 410, number of days remaining to refill the coolant in the cooling system is determined based on the depletion rate of the coolant in the cooling system using the prediction model. Notably, the selected prediction module is configured to determine a number of days remaining to refill the coolant in the cooling system. The determination of number of days remaining to refill the coolant in the cooling system is explained in detail later in the description.

At act 412, a warning signal is generated on a graphical user interface. The warning signal indicative of a number of days remaining to refill the coolant in the cooling system. The warning signal is generated as indication to alert concerned personnel or associated system to refill the coolant in the cooling system before the number of days remaining to refill the coolant the cooling device reaches a minimum threshold value. Alternatively, the warning signal is a trigger for automatically refilling the coolant in the cooling system. As used herein, the term "graphical user interface" refers to an input/output interface provided to a user or operator of the at least one imaging modality to display a number of days remaining to refill the coolant in the cooling device. In one exemplary implementation, the graphical user interface is integrated with the imaging modality and a number of days remaining to refill the coolant are displayed thereon. In another exemplary implementation, the graphical user interface is integrated with a user device such as a mobile device or a computer associated with a user of the imaging modality. Notably, the generation of warning signal is updated based on the number of days remaining to refill the coolant in the cooling storage unit of the cooling system. This provides that the depletion rate of the coolant, the number of days remaining, and the generation of warning signal is constantly updated in real-time, thereby providing uninterrupted operation of the imaging modality and preventing a breakdown of the same in severe cases. According to an embodiment, one or more actions are initiated when the determined number of days remaining to refill the coolant reaches a threshold value. For example, the method may include filling a calculated amount of coolant that is required in the cooling system prior to a point in time when the coolant level reaches at or below a minimum threshold value.

Figure 5:
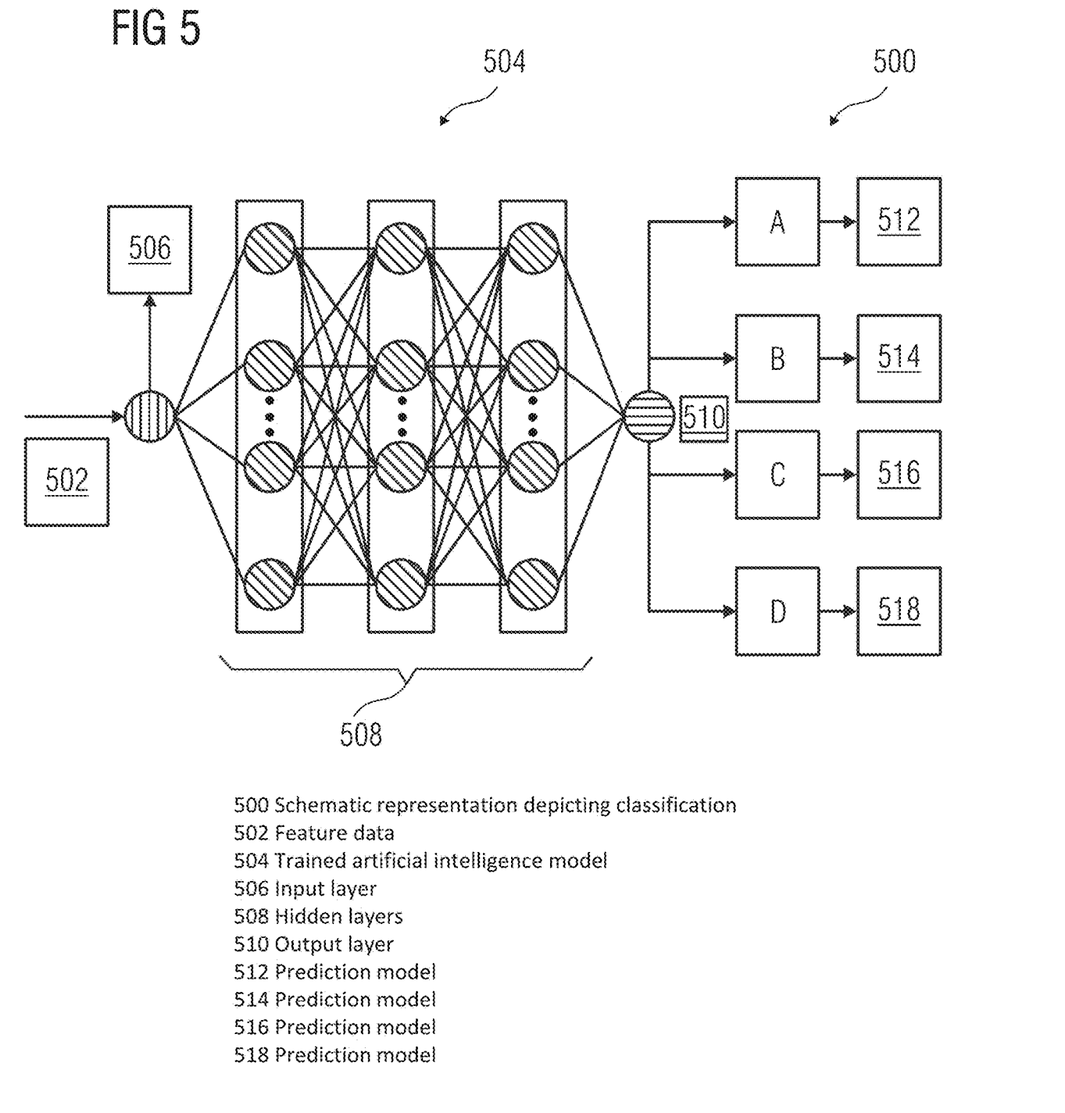
FIG. 5 is a block diagram representing classification using an artificial intelligence algorithm, according to an embodiment.

FIG. 5 is a schematic representation 500 depicting classification using an artificial intelligence algorithm, according to an embodiment. As shown, feature data 502 (hereinafter referred to as feature data from the set of signal values) is inputted at an input node of the trained artificial intelligence model 504. In an embodiment, the trained artificial intelligence model 504 is a deep neural network model which includes an input layer 506, hidden layers 508, and output layer 510. Each of the layers 506-510 includes one or more nodes. The feature data 502 is passed through input layer 506, hidden layers 508 and a class label 'A' is outputted at the output layer 510. The class label 'A' is matched with each of identifiers 'A', 'B', 'C', and 'D' associated with the prediction models 512, 514, 516, and 518, respectively. As may be seen here, the class label 'A' matches with the identifier 'A' of the prediction model 512, henceforth prediction model 512 is selected to compute the depletion rate of the coolant in the cooling system. It may be noted that the deep neural network model 504 is recursively trained to accurately classify the set of signal values into predefined classes using a training data set with pre-classified signal patterns.

Figure 6:
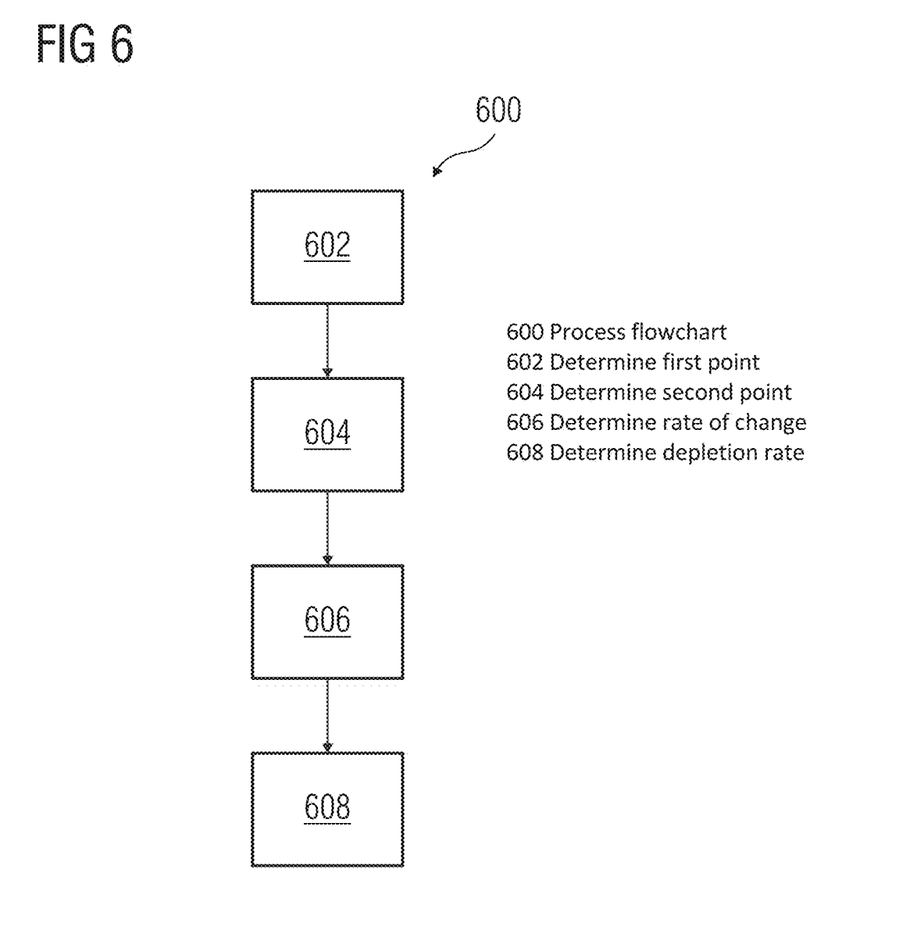
FIG. 6 illustrates a flowchart of a method of computing the depletion rate of the coolant in the cooling system, according to an embodiment.

FIG. 6 is a process flowchart 600 depicting a method for computing depletion rate of the coolant in the cooling device, according to an embodiment. At act 602, a first point is determined from the set of signal values having a maximum threshold signal value. In particular, the first point of the set of signal values (herein, the pressure signal values) is associated with a maximum level of coolant in the cooling system 110. In particular, the first point in the set of signal values correspond to a point in time when the coolant is filled in the cooling system 110. The first point is observed as a magnitude surge in the received set of signal values.

At act 604, a second point is determined from the set of signal values having a current signal value. The second point of the signal is associated with a current level of the coolant in the cooling system 110. The second point of the set of signal values is associated with a current level of the coolant in the cooling system 110. The current threshold signal value is a value observed in the set of signal values that correspond to a point in time when the cooling system 110 holds a current level of the coolant in the cooling system 110. It may be appreciated that the value of second point may change with respect to time as the second point corresponds to a point that is last received or acquired by the sensing device 204.

At act 606, a rate of change in magnitude of the set of signal values is determined with respect to the first point and the second point. The rate of change in magnitude is computed as a rate of change of decrease in magnitude between two consecutive signal values in time. In an example, an average rate of change in magnitude of signal values between the first point and the second point is determined based on rate of change in magnitude of signal values between two consecutive points in time between the first point and the second point.

At act 608, the depletion rate of the coolant in the cooling system 110 is determined based on the determined rate of change in the magnitude of the set of signal values. In some embodiments, the depletion rate of the coolant in the cooling system 110 corresponds to a rate of change in magnitude of the set of signal values. In an embodiment, the rate of decrease in magnitude of the set of signal values with respect to time is directly proportional to the depletion rate of the coolant in the cooling system 110. For example, if the magnitude of the set of signal value is decreasing with a factor of 'x' for an observed period of time, then the depletion rate of the coolant is also 'x'. Herein, the coolant in the cooling system 110 may also deplete with a factor of 'x'.

Figure 7:
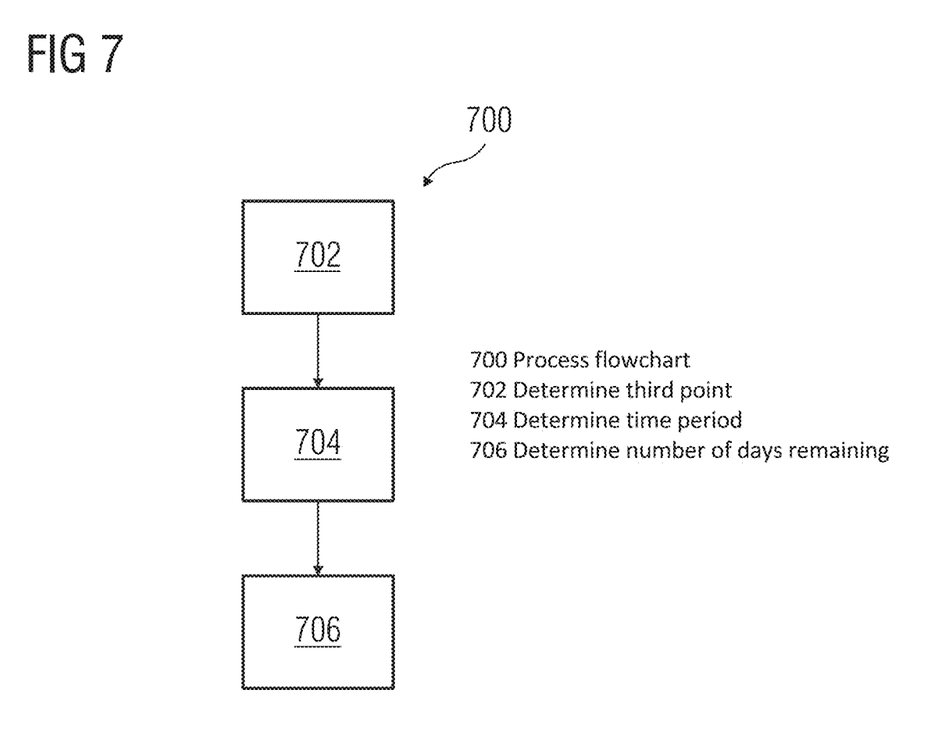
FIG. 7 illustrates a flowchart of a method of determining a number of days of depletion for a selected prediction module, according to an embodiment.

FIG. 7 is process flowchart 700 depicting a method of determining a number of days remaining to refill the coolant in the cooling system, in accordance with an embodiment. At act 702, a third point in the set of signal values (herein, the set of pressure signal values) having a minimum threshold signal value is determined. Herein, the third point corresponds to a minimum level of coolant in the cooling system. The third point corresponds to a signal value as obtained at a given point in time having a minimum threshold signal value, e.g., the signal value when the coolant in the coolant storage unit 202 reaches a minimum threshold level. The minimum threshold level of the coolant storage unit 202 may be known for a particular cooling system 110 or may be defined by the user. As an example, the third point corresponds to a pressure signal value that may be obtained when the coolant reaches the minimum threshold level in the coolant storage unit 202.

At act 704, a time period is determined between the determined second point and the predicted third point based on the depletion rate of the coolant in the cooling device 110. The three known values are used to compute a point in time when the minimum threshold level of the coolant is reached. At act 706, a number of days remaining to refill the coolant in the cooling system 110 is determined based on the determined time period. The number of days remaining to refill the coolant is calculated from the second point, e.g., the current point in time. In an example, when the time period between the second point and the third point is known, then a number of days remaining to refill the coolant in the cooling system 110 may be computed therefrom.

In an exemplary embodiment, for a given set of pressure signal values received from the sensing unit 202 are inputted into the trained artificial intelligence model. The trained artificial intelligence model classifies the given set of pressure signal values into one of the predefined classes. Herein, for example, the given set of pressure signal values is classified as "linear depletion pattern". Further, the prediction model configured to determine depletion rate for linear depletion pattern is selected from the plurality of prediction models.

Further, the selected prediction model is configured to determine the first point when the water is filled in the coolant storage unit 202. At this point in time, the pressure exerted by the coolant on the sensing device 204 is maximum and the level of the coolant in the coolant storage unit 202 is also maximum. In one or more examples, the first point is also referred to as the refill point ($R_P$). After the water is filled in the coolant storage unit 202 and the associated imaging modality is in use, the water starts to deplete. Henceforth, the magnitude of the pressure signal values ($R_P$) also decreases with depletion of water in the coolant storage unit 202. Further, the prediction model determines a second point from which the number of days remaining to refill the water is calculated. The second point is the current pressure value of water in the coolant storage unit 202. Further, the prediction model determines a third point, which is the threshold point ($R_P$_Threshold point) that is the pressure signal value of a magnitude. This threshold point may not be lower than a value for proper functioning of the imaging modality. Further, the pressure signal value for 15 days is collected from the first point, e.g., the refill point. The pressure signal values for collected over a time period, herein 15 days is moving average window size for further computation. Further, from $15^{th}$ day onwards, moving average of the pressure signal values is calculated for moving average window size, and is termed as moving average of the pressure signal (Moving average_$R_P$).

After the calculation of moving average of the pressure signal (Moving average_$R_P$), a difference between previous moving average of the pressure signal (Moving average_$R_P$) and current moving average of the pressure signal (Moving average_$R_P$) is calculated and is termed as $R_P$_Difference. After $R_P$_Difference calculation, average depletion rate (Avg_Depletion rate) is calculated by calculating moving average of $R_P$_Difference for moving average window size. Further, a number of days remaining to refill the water from the second point is calculated based upon difference between Moving average_$R_P$ and $R_P$_Threshold point divided by Avg_Depletion rate.

In an alternative embodiment, the method includes an act of classifying the received set of signal values into normal patterns and exceptional patterns. The trained artificial intelligence algorithm is trained to classify a given set of signal values belonging to any one of the predetermined classes of set of signal values as "normal pattern" and classify a given set of signal values that are unidentified and do not belong to any of the predetermined classes of set of signal values is classified as "exceptional pattern". In a case, when a given set of signals is classified as "normal pattern" by the trained artificial intelligence algorithm, then the given set of signals is further processed to determine a number of days remaining to refill the coolant in the cooling system 110 using a selected prediction model as aforementioned. In another case, when a given set of signal values is classified as an exceptional pattern, then an alert signal is generated in the associated imaging modality indicating that there may be a problem with the cooling system 110. In an example, presence of exceptional patterns as received from the sensing device 204 indicates a problem in the cooling storage unit 202 such as the sensing device 204 may have malfunctioned over a period of time, or the cooling storage unit 202 may have a leakage, or a hindrance in reception of signals from sensing unit 204.

An advantage of the disclosure is that depletion of the coolant in the cooling system 110 associated with an imaging modality is monitored in real-time. The use of this real-time status information of the number of days remaining for the coolant to deplete completely enables efficient surveillance of operation of cooling systems 110. This mitigates overheating of the imaging modality and thereby enabling an uninterrupted and continuous operation of the imaging modality. A further advantage is that accurate prediction a number of days remaining to refill the coolant provides that the imaging modality is functioning properly at all times without overheating. Another advantage is that a breakdown of the imaging modality that may be caused due to overheating is prevented as an accurate prediction and subsequent generation of the warning signal provides a timely refilling of the coolant in the cooling device 110. Furthermore, an advantage of the present disclosure is to provide an uninterrupted use of the imaging modality which in turn enhances the efficiency and efficacy of the imaging modality. Another advantage of the disclosure is that no time or data acquired in the imaging modality is lost due to overheating of the imaging modality and the patient need to be scanned multiple times due to failure of the imaging modality.

The foregoing examples have been provided merely for the purpose of explanation and are in no way to be construed as limiting of the present disclosure. While the disclosure has been described with reference to various embodiments, it is understood that the words, which have been used herein, are words of description and illustration, rather than words of limitation. Further, although the disclosure has been described herein with reference to particular means, materials, and embodiments, the disclosure is not intended to be limited to the particulars disclosed herein. Rather, the disclosure extends to all functionally equivalent structures, methods and uses, such as are within the scope of the appended claims. Those skilled in the art, having the benefit of the teachings of this specification, may effect numerous modifications thereto and changes may be made without departing from the scope of the disclosure in its aspects.

The invention claimed is:

1. A method of monitoring depletion of a coolant in a cooling system associated with at least one imaging modality, the method comprising:
   receiving, by at least one processing unit, a set of signal values from a sensing unit associated with the cooling system, wherein the set of signal values correspond to one or more parameters of the cooling system;
   determining, by the at least one processing unit, a class associated with the set of signal values using a trained artificial intelligence model;
   selecting, by the at least one processing unit, a prediction model capable of predicting a depletion rate of the coolant in the cooling system from a plurality of predetermined prediction models based on the class associated with the set of signal values;
   computing, by the at least one processing unit, the depletion rate of the coolant in the cooling system based on the set of signal values using the selected prediction model;
   determining, by the at least one processing unit, a number of days remaining to refill the coolant in the cooling system based on the depletion rate of the coolant in the cooling system;
   generating, by the at least one processing unit, a warning signal on a graphical user interface, the warning signal indicative of the number of days remaining to refill the coolant in the cooling system; and
   filling a calculated amount of the coolant in the cooling system following the generating of the warning signal and prior to a point in time when a current level of the coolant in the cooling system reaches a minimum threshold value.

2. The method of claim 1, wherein the computing of the depletion rate of the coolant in the cooling system comprises:
   determining a first point from the set of signal values having a maximum threshold signal value, wherein the first point is associated with a maximum level of the coolant in the cooling system;
   determining a second point from the set of signal values having a current signal value, wherein the second point is associated with the current level of the coolant in the cooling system;
   determining a rate of change in magnitude of the set of signal values with respect to the first point and the second point; and
   determining the depletion rate of the coolant in the cooling system based on the determined rate of change in the magnitude of the set of signal values.

3. The method of claim 2, wherein the determining of the number of days remaining to refill the coolant in the cooling system comprises:
   determining a third point in the set of signal values having a minimum threshold signal value, wherein the third point corresponds to a minimum level of the coolant in the cooling system;
   predicting a time period between the second point and the third point based on the depletion rate of the coolant in the cooling system; and
   determining the number of days remaining to refill the coolant in the cooling system based on the predicted time period.

4. The method of claim 3, wherein the depletion rate of the coolant in the cooling system corresponds to the rate of change in the magnitude of the set of signal values.

5. The method of claim 1, wherein the depletion rate of the coolant in the cooling system corresponds to a rate of change in a magnitude of the set of signal values.

6. The method of claim 1, further comprising:
   processing the set of signal values to remove one or more anomalies.

7. The method of claim 6, wherein the processing of the set of signal values comprises replacing one or more missing signal values in the set of signal values with a previously obtained set of values in the set of the signal values to obtain a continuous set of signal values.

8. A system comprising:
   a cooling system having a sensing unit configured to receive a set of signal values corresponding to one or more parameters of the cooling system;
   at least one processing unit; and a memory unit coupled to the processing unit, wherein the memory unit comprises a set of machine-readable instructions executable by the processing unit, wherein the set of machine-readable instructions cause the processing unit to:

receive the set of signal values from the sensing unit;

determine a class associated with the set of signal values using a trained artificial intelligence model;

select a prediction model capable of predicting a depletion rate of a coolant in the cooling system from a plurality of predetermined prediction models based on the class associated with the set of signal values;

compute the depletion rate of the coolant in the cooling system based on the set of signal values using the selected prediction model;

determine a number of days remaining to refill the coolant in the cooling system based on the depletion rate of the coolant in the cooling system;

generate a warning signal on a graphical user interface, the warning signal indicative of the number of days remaining to refill the coolant in the cooling system; and fill a calculated amount of the coolant in the cooling system associated with the at least one imaging modality following the generation of the warning signal and prior to a point in time when a current level of the coolant in the cooling system reaches a minimum threshold value.

9. The system of claim 8, wherein the processing unit is further configured to:

determine a first point from the set of signal values having a maximum threshold signal value, wherein the first point is associated with a maximum level of the coolant in the cooling system;

determine a second point from the set of signal values having a current signal value, wherein the second point is associated with the current level of the coolant in the cooling system;

determine a rate of change in magnitude of the set of signal values with respect to the first point and the second point; and determine the depletion rate of the coolant in the cooling system based on the determined rate of change in the magnitude of the set of signal values.

10. The system of claim 9, wherein the processing unit is further configured to:

determine a third point in the set of signal values having a minimum threshold signal value, wherein the third point corresponds to a minimum level of the coolant in the cooling system;

predict a time period between the second point and the third point based on the depletion rate of the coolant in the cooling system; and determine the number of days remaining to refill the coolant in the cooling system, based on the predicted time period.

11. The system of claim 10, wherein the depletion rate of the coolant in the cooling system corresponds to the rate of change in the magnitude of the set of signal values.

12. The system of claim 8, wherein the depletion rate of the coolant in the cooling system corresponds to a rate of change in a magnitude of the set of signal values.

13. The system of claim 8, wherein the processing unit is further configured to process the set of signal values to remove one or more anomalies.

14. The system of claim 13, wherein processing unit is further configured to replace one or more missing signal values in the set of signal values with a previously obtained set of values in the set of the signal values to obtain a continuous set of signal values.

15. A cooling system comprising:

a coolant storage unit configured to store a coolant;

a sensing unit configured to measure a set of signal values corresponding to one or more parameters of the coolant storage unit;

at least one processing unit; and a memory unit coupled to the processing unit, wherein the memory unit comprises a set of machine-readable instructions executable by the processing unit, wherein the set of machine-readable instructions cause the processing unit to:

receive the set of signal values from the sensing unit, wherein the set of signal values correspond to one or more parameters of the cooling system;

determine a class associated with the set of signal values using a trained artificial intelligence model;

select a prediction model capable of predicting a depletion rate of the coolant in the cooling system from a plurality of predetermined prediction models based on the class associated with the set of signal values;

compute the depletion rate of the coolant in the cooling system based on the set of signal values using the selected prediction model;

determine a number of days remaining to refill the coolant in the cooling system based on the depletion rate of the coolant in the cooling system;

generate a warning signal on a graphical user interface, the warning signal indicative of the number of days remaining to refill the coolant in the cooling system; and fill a calculated amount of the coolant in the cooling system associated with the at least one imaging modality following the generation of the warning signal and prior to a point in time when a current level of the coolant in the cooling system reaches a minimum threshold value.

* * * * *